US008988891B2

(12) United States Patent
Luo et al.

(10) Patent No.: US 8,988,891 B2
(45) Date of Patent: Mar. 24, 2015

(54) MICRO AND MILLIMETER WAVES CIRCUIT

(75) Inventors: Bing Luo, Chengdu (CN); Franco Marconi, Milan (IT)

(73) Assignee: Huawei Technologies Co., Ltd., Shenzhen (CN)

(*) Notice: Subject to any disclaimer, the term of this patent is extended or adjusted under 35 U.S.C. 154(b) by 197 days.

(21) Appl. No.: 13/478,324

(22) Filed: May 23, 2012

(65) Prior Publication Data

US 2012/0243185 A1 Sep. 27, 2012

Related U.S. Application Data

(63) Continuation of application No. PCT/CN2011/073724, filed on May 6, 2011.

(30) Foreign Application Priority Data

Jul. 31, 2010 (CN) .......................... 2010 1 0241422

(51) Int. Cl.
 H05K 1/18 (2006.01)
 H01L 23/367 (2006.01)
 H05K 1/02 (2006.01)
 (Continued)

(52) U.S. Cl.
 CPC ............. *H01L 23/3677* (2013.01); *H01L 23/13* (2013.01); *H05K 1/021* (2013.01); *H05K 1/0243* (2013.01); *H05K 2201/09054* (2013.01);
 (Continued)

(58) Field of Classification Search
 CPC ................. H01L 2924/01078; H01L 23/5389; H01L 2224/16; H01L 2924/01079; H05K 1/182

USPC .................................... 361/761; 257/706–707
See application file for complete search history.

(56) References Cited

U.S. PATENT DOCUMENTS 5,012,386 A * 4/1991 McShane et al. ............. 361/715
5,379,187 A 1/1995 Lee et al.
(Continued)

FOREIGN PATENT DOCUMENTS

CN 1197286 A 10/1998
CN 101415297 A 4/2009
(Continued)

OTHER PUBLICATIONS

Foreign Communication From a Counterpart Application, PCT Application PCT/CN2011/073724, Written Opinion dated Aug. 18, 2011, 5 pages.
(Continued)

*Primary Examiner* — Jenny L Wagner
*Assistant Examiner* — Michael P McFadden
(74) *Attorney, Agent, or Firm* — Conley Rose, P.C.; Grant Rodolph; Nicholas K. Beaulieu

(57) ABSTRACT

Embodiments of the present invention provide a micro and millimeter waves circuit, including: a multi-layer circuit board, a heat substrate, and a circuit module. The multi-layer circuit board is opened with a window. The heat substrate includes a base. The multi-layer circuit board is attached to the base. The heat substrate further includes a projecting part extending from the base into the window of the multi-layer circuit board. The circuit module is received in the window and placed on the projecting part. The circuit module is electrically connected with an outer conductor layer of the multi-layer circuit board.

20 Claims, 5 Drawing Sheets

(51) Int. Cl.
  *H01L 23/66* (2006.01)
  *H01L 23/13* (2006.01)
(52) U.S. Cl.
  CPC ......... *H01L23/66* (2013.01); *H01L 2223/6627* (2013.01); *H01L 2224/48227* (2013.01)
  USPC .......................................... 361/761; 361/748

(56) References Cited

U.S. PATENT DOCUMENTS

| | | | |
|---|---|---|---|
| 6,292,374 B1 * | 9/2001 | Johnson et al. | 361/808 |
| 6,625,028 B1 | 9/2003 | Dove et al. | |
| 6,683,795 B1 | 1/2004 | Yoo | |
| 2004/0099364 A1 * | 5/2004 | Suzuki et al. | 156/89.11 |
| 2008/0048120 A1 | 2/2008 | Gooch | |

FOREIGN PATENT DOCUMENTS

| | | |
|---|---|---|
| CN | 101937900 A | 1/2011 |
| WO | 2009052761 A1 | 4/2009 |
| WO | 2012016460 A1 | 2/2012 |

OTHER PUBLICATIONS

International search report for International application No. PCT/CN2011/073724, dated Aug. 18, 2011, total 5 pages.
Chinese office action for Chinese application No. 201010241422X, dated Nov. 16, 2011, and a partial English translation thereof, total 7 pages.
Foreign Communication From a Counterpart Application, European Application No. 11814043.3, Extended European Search Report dated Sep. 4, 2014, 6 pages.

* cited by examiner

MICRO AND MILLIMETER WAVES CIRCUIT

CROSS-REFERENCE TO RELATED APPLICATIONS

This application is a continuation of International Application No. PCT/CN2011/073724, filed on May 6, 2011, which claims priority to Chinese Patent Application No. 201010241422.X, filed on Jul. 31, 2010, both of which are hereby incorporated by reference in their entireties.

FIELD OF THE INVENTION

The present invention relates to the field of communications technologies, and in particular, to a micro and millimeter waves circuit.

BACKGROUND OF THE INVENTION

As shown in FIG. 9, an existing MMW (Micro and Millimeter Waves, micro and millimeter waves) circuit includes a circuit board (for example, a PCB). The circuit board is placed on a heat substrate (a metal block with heat conductivity, such as a copper block or an aluminum block). The circuit board is opened with a window. A bare chip is placed in the window, and placed on the heat substrate.

The bare chip is adhered on the heat substrate through electrical conduction materials such as silver paste, so that good heat conduction and electrical conduction connection exists between the bare chip and the heat substrate. The bare chip is electrically connected to a conductor layer on a surface of the circuit board through a bonding wire. In this structure, reference ground of the bare chip, the bonding wire, and a micro-strip line that is placed on the circuit board are all the heat substrate.

The circuit board adopted in the existing MMW circuit is only disposed with one layer of conductors, so large-scale circuit design cannot be implemented.

SUMMARY OF THE INVENTION

Embodiments of the present invention provide a micro and millimeter waves circuit, so as to implement large-scale circuit design.

The embodiments of the present invention provide the following technical solutions.

A micro and millimeter waves circuit includes: a multi-layer circuit board, a heat substrate, and a circuit module, the multi-layer circuit board is opened with a window, the heat substrate includes a base, the multi-layer circuit board is attached to the base, the heat substrate further includes a projecting part extending from the base into the window of the multi-layer circuit board, the circuit module is received in the window and placed on the projecting part, and the circuit module is electrically connected with an outer conductor layer of the multi-layer circuit board.

A communication device includes a circuit packaging module, where the circuit packaging module includes a micro and millimeter waves circuit, the micro and millimeter waves circuit includes: a multi-layer circuit board, a heat substrate, and a circuit module, the multi-layer circuit board is opened with a window, the heat substrate includes a base, the multi-layer circuit board is attached to the base, the heat substrate further includes a projecting part extending from the base into the window of the multi-layer circuit board, the circuit module is received in the window and placed on the projecting part, and the circuit module is electrically connected with an outer conductor layer of the multi-layer circuit board.

It may be seen from the foregoing technical solutions provided by the embodiments of the present invention that, the circuit module is supported in the form of disposing the projecting part on the base of the heat substrate, so that two or even more conductor layers may be disposed in the multi-layer circuit board, and the more conductor layers can bear more wiring. In this way, the large-scale circuit design may be implemented on the circuit board with multiple layers.

BRIEF DESCRIPTION OF THE DRAWINGS

To illustrate the technical solutions according to the embodiments of the present invention more clearly, accompanying drawings needed for describing the embodiments are introduced briefly in the following. Apparently, the accompanying drawings in the following description are only some embodiments of the present invention, and persons of ordinary skill in the art may further obtain other drawings from the accompanying drawings without creative efforts.

DETAILED DESCRIPTION OF THE EMBODIMENTS

To facilitate understanding of the embodiments of the present invention, explanation and illustration are further given in the following by taking several specific embodiments as examples with reference to the accompanying drawings, and each embodiment is not intended to limit the embodiments of the present invention.

Figure 1:
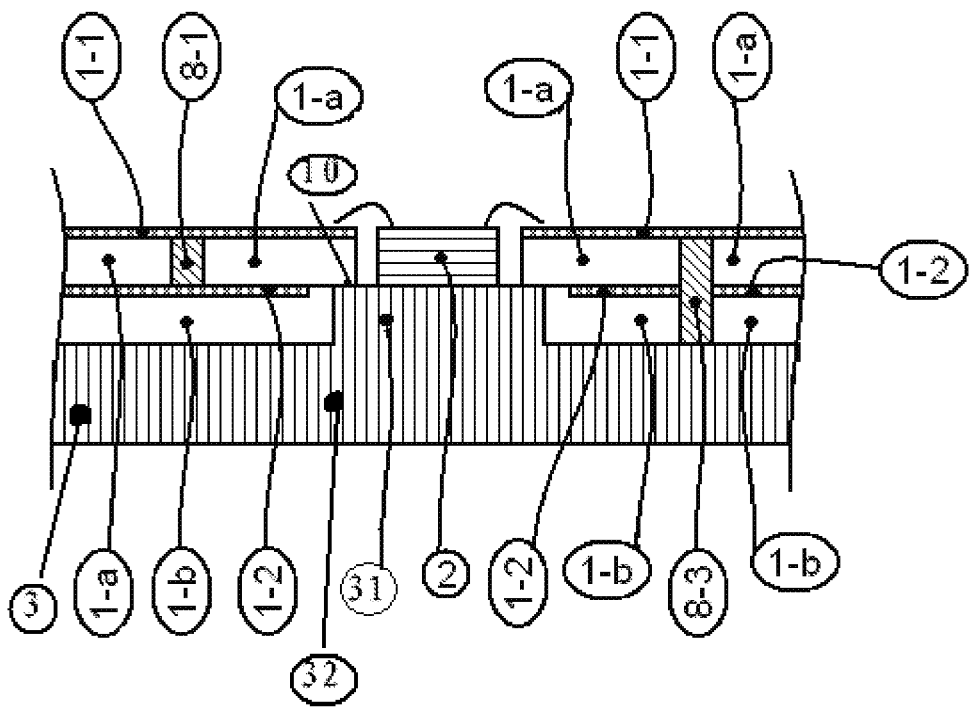
FIG. 1 is a schematic diagram of an embodiment of a micro and millimeter waves circuit according to the present invention.

As shown in FIG. 1, the present invention provides an embodiment of a micro and millimeter waves circuit, including: a multi-layer circuit board, a heat substrate 3, and a circuit module 2. The multi-layer circuit board is opened with a window. The heat substrate 3 includes a base 32. The multi-layer circuit board is attached to the base 32. The heat substrate 3 further includes a projecting part 31 extending from the base into the window of the multi-layer circuit board. The circuit module 2 is received in the window and placed on the projecting part 3. The circuit module 2 is electrically connected with an outer conductor layer 1-1 of the multi-layer circuit board.

In the foregoing embodiment of the present invention, the circuit module 2 is supported in the form of disposing the projecting part 31 on the base 32 of the heat substrate 3, so that two or even more conductor layers may be disposed in the multi-layer circuit board, and the more conductor layers can bear more PCB wiring. In this way, large-scale circuit design may be implemented on the circuit board with multiple layers.

In FIG. 1, a multi-layer circuit board with two conductor layers is taken as an example for description. In FIG. 1, 1-*a* is an insulation layer a of the multi-layer circuit board, 1-2 is an inner conductor layer of the multi-layer circuit board, 1-*b* is an insulation layer b of the multi-layer circuit board, 8-1 is a via hole that connects the outer conductor layer to the inner conductor layer, 8-3 is a via hole that connects the outer conductor layer of the multi-layer circuit board and the inner conductor layer of the multi-layer circuit board, and the heat substrate.

In the foregoing embodiment of the present invention, other parts, for example, a part playing a role of elevation, may be further disposed between the multi-layer circuit board and the base 32.

In the foregoing embodiment of the present invention, the heat substrate may include a metal block with heat conduction and electrical conduction functions, for example, a copper block, or an aluminum block, or a combination of the copper block and the aluminum block.

In the foregoing embodiment of the present invention, the circuit module may include a module disposed with a circuit. For example, the circuit module may include a chip (for example, a bare chip) or an integrated circuit.

In the foregoing embodiment of the present invention, the height of the projecting part may be set to an extent that the projecting part can play a role of supporting the circuit module. For example, the projecting part may support the circuit module, so that the circuit module is located at a height which is approximately flush with the outer conductor layer of the multi-layer circuit board, or, so that the circuit module is slightly projecting out of the outer conductor layer of the multi-layer circuit board, or, so that the circuit module is slightly lower than the outer conductor layer of the multi-layer circuit board.

Furthermore, the height of the projecting part may be flush with a conductor layer where reference ground of a micro-strip line of the multi-layer circuit board is located, or, the projecting part is higher than a conductor layer where reference ground of a micro-strip line of the multi-layer circuit board is located, or the projecting part is lower than a conductor layer where reference ground of a micro-strip line of the multi-layer circuit board is located. The micro-strip line of the multi-layer circuit board may be located at the outer conductor layer of the multi-layer circuit board, so a reference layer of the micro-strip line is a second conductor layer counted from the outer conductor layer to the inside. Furthermore, if the second conductor layer counted from the outer conductor layer to the inside is caverned, the reference layer may be located at a third conductor layer counted from the outer conductor layer to the inside, and the rest may be deduced by analogy.

As shown in FIG. 1, in the foregoing embodiment of the present invention, a side wall of the window may be step-like and forms a step surface 10. The step surface 10 butts against a top surface of the projecting part.

In the foregoing embodiment of the present invention, a manner in which the circuit module is electrically connected with the outer conductor layer 1-1 of the multi-layer circuit board may be as follows.

Electrical connection may be implemented through a bonding wire (as shown in FIG. 1), and may also be implemented through a connector.

In the foregoing embodiment of the present invention, a manner in which the circuit module is electrically connected with the heat substrate may be as follows.

The circuit module may be adhered and fixed through electrical conduction materials such as silver paste, so as to ensure good electrical connection between the circuit module and the heat substrate, and implement a heat conduction function.

Figure 2:
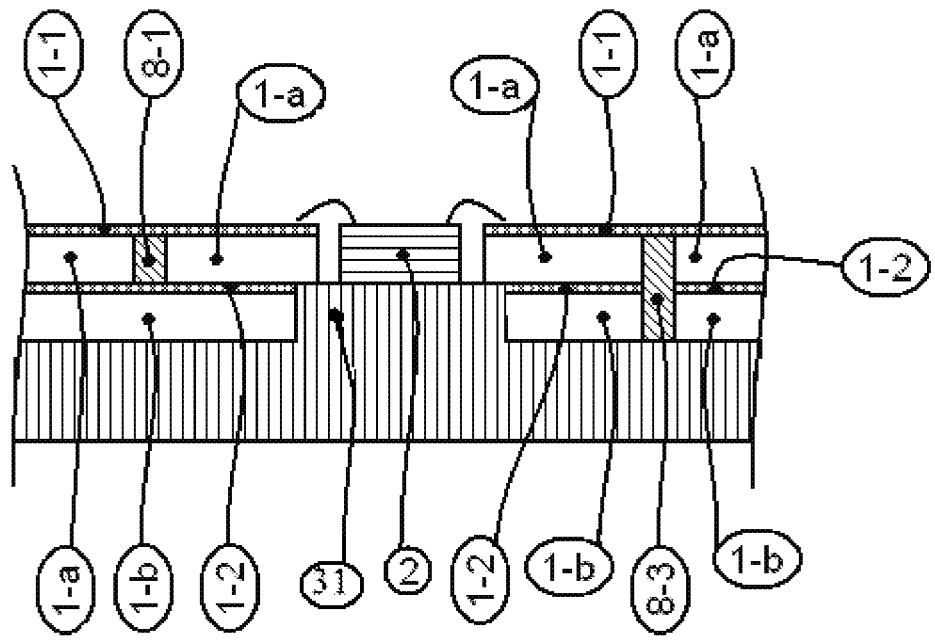
FIG. 2 is a schematic diagram of an embodiment of another micro and millimeter waves circuit according to the present invention.
Figure 7:
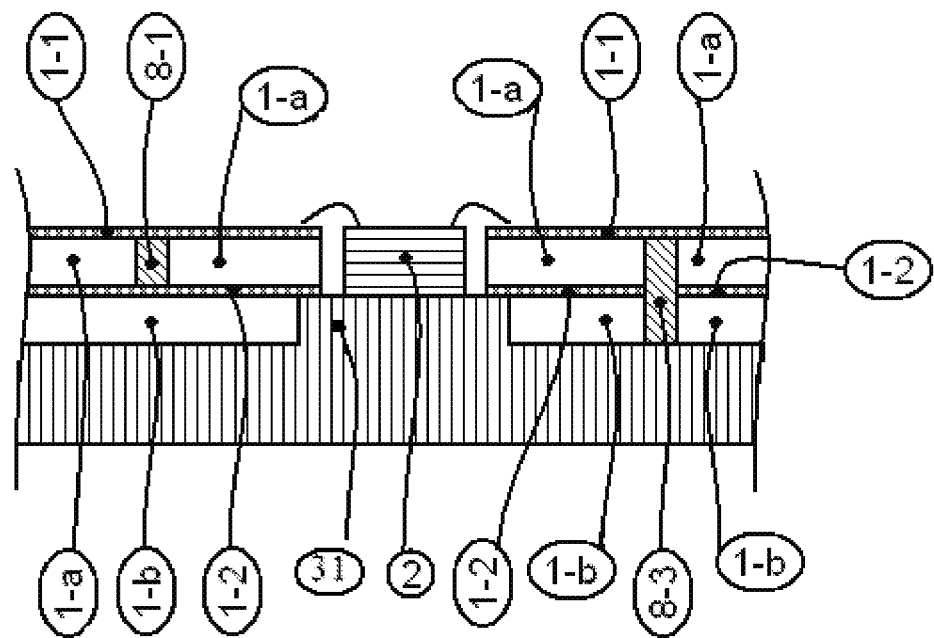
FIG. 7 is a schematic diagram of an embodiment of another micro and millimeter waves circuit according to the present invention.

As shown in FIG. 2 and FIG. 7, in the foregoing embodiment of the present invention, the conductor layer where the reference ground of the micro-strip line of the multi-layer circuit board is located is electrically connected with a side surface of the projecting part, or, the conductor layer where the reference ground of the micro-strip line of the multi-layer circuit board is located is electrically connected with the top surface of the projecting part. It should be noted that, a manner in which the conductor layer where the reference ground of the micro-strip line of the multi-layer circuit board is located is electrically connected with the side surface of the projecting part or the top surface of the projecting part may be as follows: Electrical connection is implemented after contact, or, an electrical conduction material (for example, silver paste) is applied on a contact surface between the conductor layer where the reference ground of the micro-strip line of the multi-layer circuit board is located and the side surface of the projecting part or the top surface of the projecting part to implement the electrical connection.

The conductor layer where the reference ground of the micro-strip line of the multi-layer circuit board is located is electrically connected with the projecting part, so that reference ground of both the circuit module and the micro-strip line located at the multi-layer circuit board is the heat substrate. In this case, the reference ground is a completely continuous structure, thereby reducing a reflection problem caused by discontinuity of the reference ground.

Figure 4:
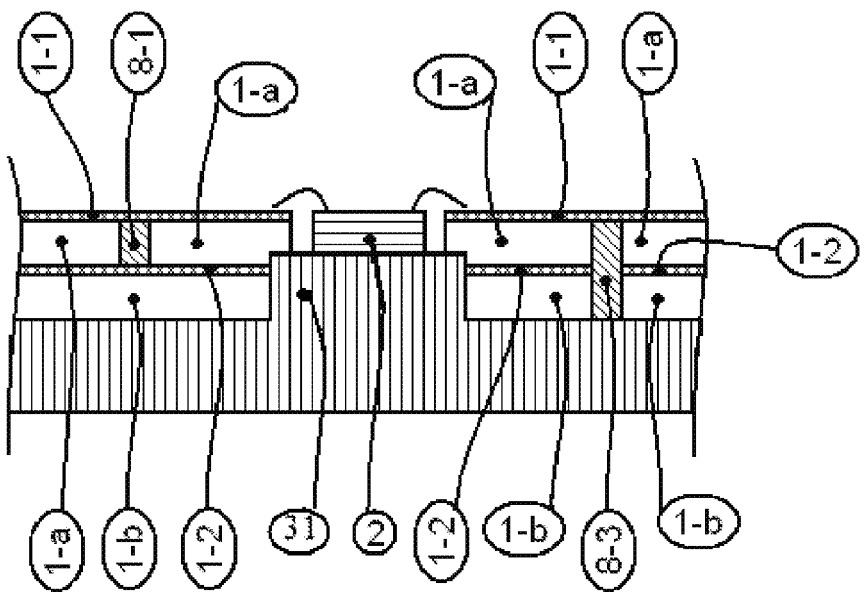
FIG. 4 is a schematic diagram of an embodiment of another micro and millimeter waves circuit according to the present invention.

Further, as shown in FIG. 2 and FIG. 4, in the foregoing embodiment of the present invention, a height of the projecting part is not less than that of the conductor layer where the reference ground of the micro-strip line of the multi-layer circuit board is located, so that the side surface of the projecting part contacts the conductor layer where the reference ground of the micro-strip line of the multi-layer circuit board is located, thereby implementing electrical connection.

Figure 3:
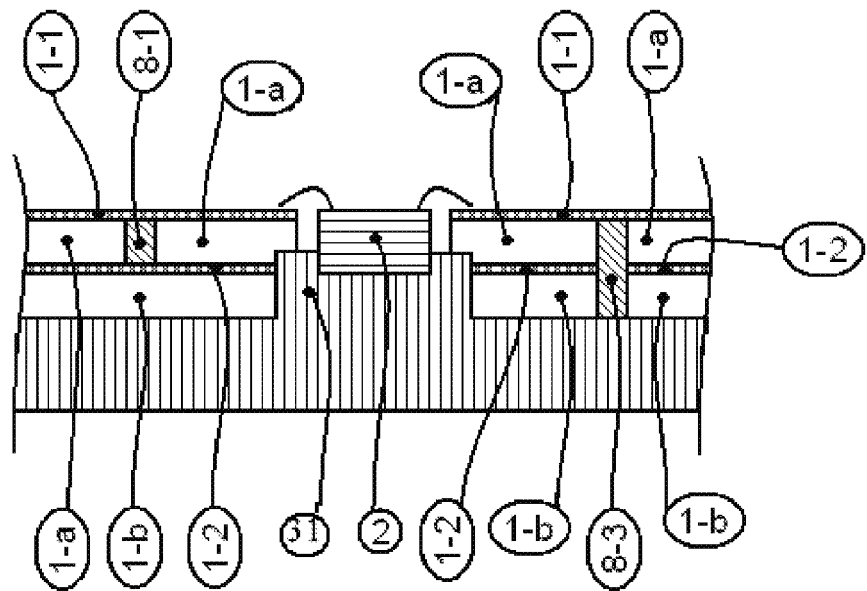
FIG. 3 is a schematic diagram of an embodiment of another micro and millimeter waves circuit according to the present invention.

As shown in FIG. 3, in the embodiment of the present invention, a groove may be opened in the top surface of the projecting part, and the circuit module 2 may be received in the groove.

Figure 5:
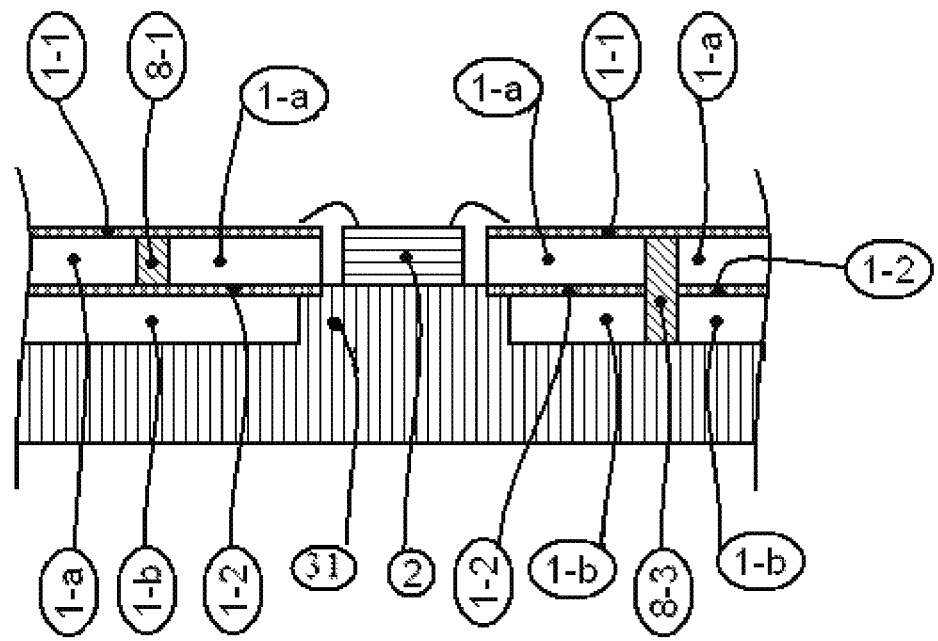
FIG. 5 is a schematic diagram of an embodiment of another micro and millimeter waves circuit according to the present invention.

As shown in FIG. 5, in the foregoing embodiment of the present invention, a notch may be disposed at an edge of the top surface of the projecting part, and the conductor layer where the reference ground of the micro-strip line of the multi-layer circuit board is located butts against the notch, thereby implementing electrical connection with the projecting part.

Figure 6:
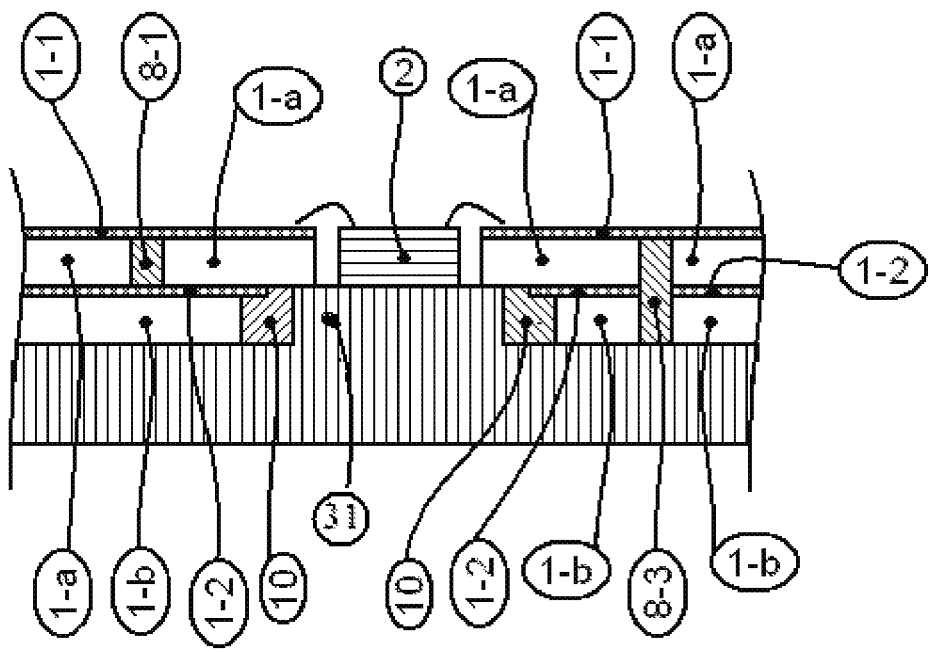
FIG. 6 is a schematic diagram of an embodiment of another micro and millimeter waves circuit according to the present invention.

As shown in FIG. 6, in the foregoing embodiment of the present invention, an electrical conduction PP (Pre-Preg, pre-preg) may be disposed at a side of the projecting part, a groove is disposed at an edge of the electrical conduction PP, and the conductor layer where the reference ground of the micro-strip line of the multi-layer circuit board is located butts against the groove, thereby implementing electrical connection with the projecting part. The electrical conduction PP has fluidity under high temperature and high pressure, may be filled and connected between the conductor layer where the reference ground of the micro-strip line of the multi-layer circuit board is located and the projecting part, and may remedy machining errors of the projecting part and the conductor layer where the reference ground of the micro-strip line of the multi-layer circuit board is located.

The electrical conduction PP may be set to be annular and nested on the projecting part.

Figure 8:
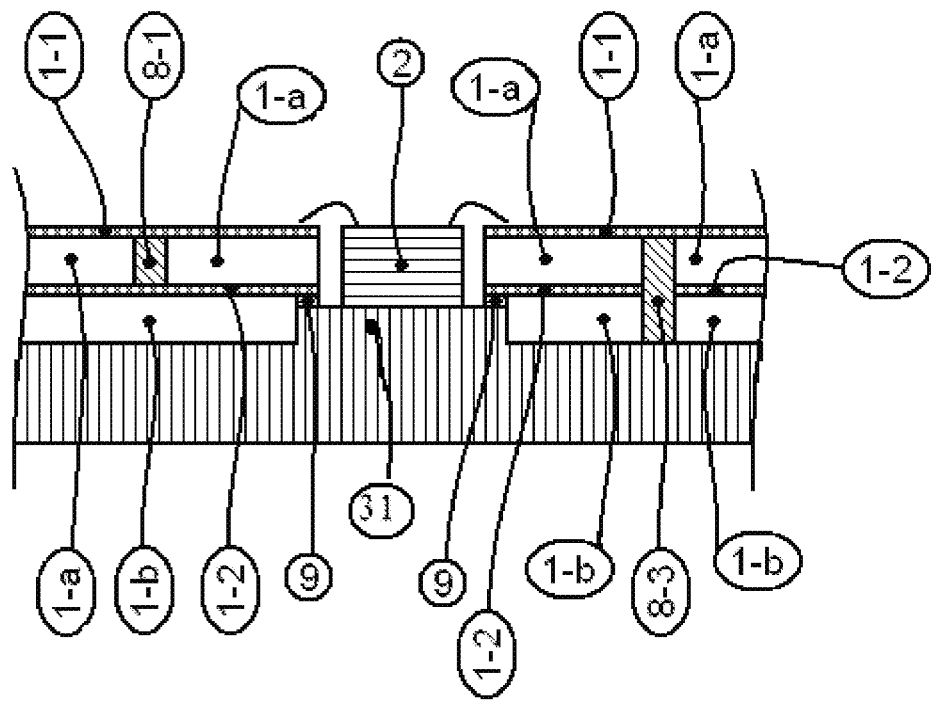
FIG. 8 is a schematic diagram of an embodiment of another micro and millimeter waves circuit according to the present invention.
Figure 9:
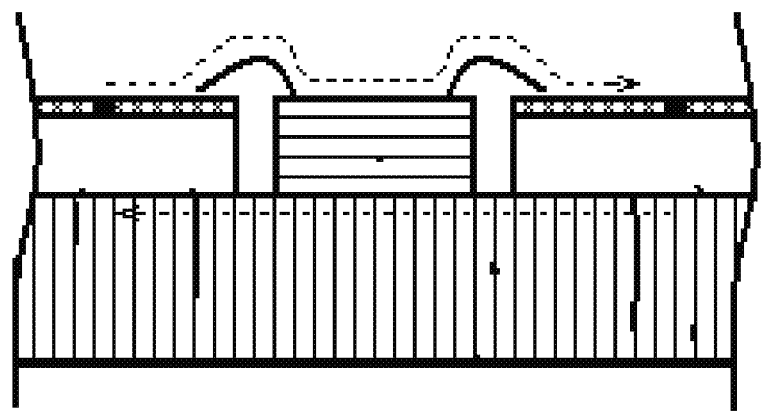
FIG. 9 is a schematic diagram of an existing micro and millimeter waves circuit.

As shown in FIG. 8, in the embodiment of the present invention, silver paste or other types of electrical conduction adhesives may be used for adhesion on a contact surface between the top surface of the projecting part and the conductor layer where the reference ground of the micro-strip line of the multi-layer circuit board is located. For example, before PCB lamination is made, a layer of electrical conduction adhesive may be first applied on a contact part between the projecting part and the conductor layer where the reference ground of the micro-strip line of the multi-layer circuit board is located. The electrical conduction adhesive has a function of extensive deformation and therefore may remedy a height error of the projecting part.

An embodiment of the present invention further provides a communication device, including: a circuit packaging module. The circuit packaging module includes a micro and millimeter waves circuit. The micro and millimeter waves circuit according to the embodiment includes: a multi-layer circuit board, a heat substrate, and a circuit module. The multi-layer circuit board is opened with a window. The heat substrate includes a base. The multi-layer circuit board is attached to the base. The heat substrate further includes a projecting part extending from the base into the window of the multi-layer circuit board. The circuit module is received in the window and placed on the projecting part. The circuit module is electrically connected with an outer conductor layer of the multi-layer circuit board.

The circuit packaging module is a module packaged with a circuit.

The circuit packaging module may be a chip packaging module, or a multi-chip module MCM (Multi-Chip packaging Module), or a system in package module SIP (System In Package).

The communication device may be a base station or a router, and so on.

The foregoing descriptions are merely specific exemplary implementation manners of the present invention, but are not intended to limit the protection scope of the present invention. Any variation or replacement occurring to persons skilled in the art without departing from the technical scope disclosed in the present invention shall fall within the protection scope of the present invention. Therefore, the protection scope of the present invention is subject to the protection scope of the claims.

What is claimed is:

1. A micro and millimeter waves circuit, comprising:
a multi-layer circuit board;
a heat substrate; and
a circuit module,
wherein the multi-layer circuit board is opened with a window,
wherein the heat substrate comprises a base,
wherein the multi-layer circuit board is attached to the base,
wherein the heat substrate further has a projecting part that is integrally formed with the base of the heat substrate and is made of a same material as the base,
wherein the projecting part extends from the base into the window of the multi-layer circuit board,
wherein the projecting part comprises a recessed groove in a center of the projecting part,
wherein the circuit module is received in the window and placed in the recessed groove of the projecting part,
wherein the multi-layer circuit board comprises an outer conductor layer having a micro-strip line, an inner conductor layer having a reference ground of the micro-strip line, a first insulation layer between the outer conductor layer and the inner conductor layer, and a second insulation layer between the inner conductor layer and the base of the heat substrate,
wherein the circuit module is electrically connected with the outer conductor layer of the multi-layer circuit board,
wherein the reference ground of the micro-strip line of the inner conductor layer is electrically connected to the projecting part such that reference ground of both the circuit module and the micro-strip line of the outer conductor layer comprises the heat substrate,
wherein the heat substrate comprises a first thickness, a second thickness, and a third thickness,
wherein the first thickness is less than the second thickness,
wherein the second thickness is less than the third thickness,
wherein a portion of the heat substrate that is adjacent to the second insulation layer comprises the first thickness,
wherein a portion of the heat substrate that includes the recessed groove comprises the second thickness, and
wherein a portion of the heat substrate that is adjacent to the first insulation layer comprises the third thickness.

2. The micro and millimeter waves circuit according to claim 1, wherein the circuit module comprises a bare chip or an integrated circuit, wherein a base of the bare chip or a base of the integrated circuit fits within the recessed groove, and wherein a top portion of the bare chip or a top portion of the integrated circuit extends outward from the recessed groove.

3. The micro and millimeter waves circuit according to claim 1, wherein a side wall of the window is step-like and forms a step surface, and the step surface butts against a top surface of the projecting part.

4. The micro and millimeter waves circuit according to claim 1, wherein a height of the projecting part is not less than that of the inner conductor layer where the reference ground of the micro-strip line of the multi-layer circuit board is located such that a side surface of the projecting part contacts the inner conductor layer where the reference ground of the micro-strip line of the multi-layer circuit board is located.

5. The micro and millimeter waves circuit according to claim 1, wherein a notch is disposed at an edge of a top surface of the projecting part, and the inner conductor layer where the reference ground of the micro-strip line of the multi-layer circuit board is located butts against the notch.

6. The micro and millimeter waves circuit according to claim 1, wherein an electrical conduction adhesive is used for adhesion on a contact surface between a top surface of the projecting part and the inner conductor layer where the reference ground of the micro-strip line of the multi-layer circuit board is located.

7. The micro and millimeter waves circuit according to claim 1, wherein an electrical conduction pre-preg is disposed at a side of the projecting part, a groove is disposed at an edge of the electrical conduction pre-preg, and the inner conductor layer where the reference ground of the micro-strip line of the multi-layer circuit board is located butts against the groove.

8. A communication device, comprising:
a circuit packaging module;
a heat substrate; and
a circuit module,
wherein the circuit packaging module comprises a micro and millimeter waves circuit,
wherein the micro and millimeter waves circuit comprises a multi-layer circuit board,
wherein the multi-layer circuit board is opened with a window,
wherein the heat substrate comprises a base,
wherein the multi-layer circuit board is attached to the base,
wherein the heat substrate further comprises a projecting part that is integrally formed with the base of the heat substrate and is made of a same material as the base,
wherein the projecting part extends from the base into the window of the multi-layer circuit board,
wherein the projecting part comprises a recessed groove in a center of the projecting part,
wherein the circuit module is received in the window and placed in the recessed groove of the projecting part,
wherein the multi-layer circuit board comprises an outer conductor layer having a micro-strip line, an inner conductor layer having a reference ground of the micro-strip line, a first insulation layer between the outer conductor layer and the inner conductor layer, and a second insulation layer between the inner conductor layer and the base of the heat substrate,
wherein the circuit module is electrically connected with the outer conductor layer of the multi-layer circuit board,
wherein the reference ground of the micro-strip line of the inner conductor layer is electrically connected to the projecting part such that reference ground of both the circuit module and the micro-strip line of the outer conductor layer comprises the heat substrate,
wherein the heat substrate comprises a first thickness, a second thickness, and a third thickness,
wherein the first thickness is less than the second thickness,
wherein the second thickness is less than the third thickness,
wherein a portion of the heat substrate that is adjacent to the second insulation layer comprises the first thickness,
wherein a portion of the heat substrate that includes the recessed groove comprises the second thickness, and
wherein a portion of the heat substrate that is adjacent to the first insulation layer comprises the third thickness.

9. The communication device according to claim 8, wherein the circuit packaging module is a chip packaging module, a multi-chip packaging module, or a system in package module, wherein a base of the chip packaging module, a base of the multi-chip packaging module, or a base of the system in package module fits within the recessed groove, and wherein a top portion of the chip packaging module, a top portion of the multi-chip packaging module, or a top portion of the system in package module extends outward from the recessed groove.

10. The micro and millimeter waves circuit according to claim 1, wherein the second insulation layer is positioned proximate to the heat substrate.

11. The micro and millimeter waves circuit according to claim 10, wherein the inner conductive layer is in direct contact with the projecting part.

12. The micro and millimeter waves circuit according to claim 10, wherein the inner conductive layer is in indirect contact with the projecting part through a conductive adhesive.

13. The micro and millimeter waves circuit according to claim 1, wherein the base and the projecting part of the heat substrate comprise an aluminum block.

14. The micro and millimeter waves circuit according to claim 1, wherein the base and the projecting part of the heat substrate comprise a copper block.

15. The communication device according to claim 8, wherein the inner conductive layer is in direct contact with the projecting part.

16. The communication device according to claim 8, wherein the inner conductive layer is in indirect contact with the projecting part through a conductive adhesive.

17. The communication device according to claim 8, wherein the base and the projecting part of the heat substrate comprise an aluminum block.

18. The communication device according to claim 8, wherein the base and the projecting part of the heat substrate comprise a copper block.

19. The micro and millimeter waves circuit according to claim 1, further comprising at least one first via and at least one second via, wherein the at least one first via passes through the first insulation layer and electrically connects the outer conductive layer and the inner conductive layer, and wherein the at least one second via passes through the first insulation layer, the inner conductive layer, and the second insulation layer and electrically connects the outer conductive layer, the inner conductive layer, and the heat substrate.

20. The communication device according to claim 8, further comprising at least one first via and at least one second via, wherein the at least one first via passes through the first insulation layer and electrically connects the outer conductive layer and the inner conductive layer, and wherein the at least one second via passes through the first insulation layer, the inner conductive layer, and the second insulation layer and electrically connects the outer conductive layer, the inner conductive layer, and the heat substrate.

* * * * *